United States Patent [19]
Okita

[11] Patent Number: 6,131,179
[45] Date of Patent: Oct. 10, 2000

[54] REED-SOLOMON DECODING DEVICE

[75] Inventor: Shigeru Okita, Tokyo, Japan

[73] Assignee: Texas Instruments Incorporated, Dallas, Tex.

[21] Appl. No.: 09/074,559

[22] Filed: May 7, 1998

[51] Int. Cl.⁷ .................................................. H03M 13/00
[52] U.S. Cl. ........................................................ 714/784
[58] Field of Search .................................. 714/784, 756; 708/492

[56] References Cited

U.S. PATENT DOCUMENTS

| | | | |
|---|---|---|---|
| 4,142,174 | 2/1979 | Chen et al. | 714/784 |
| 4,649,541 | 3/1987 | Lahmeyer | 714/784 |
| 5,715,262 | 2/1998 | Gupta | 714/784 |
| 5,942,055 | 8/1999 | Hassner et al. | 714/784 |

OTHER PUBLICATIONS

Paar et al., Cpomarison of Arithmetic Architecture for Reed–Solomon Decoders in Reconfigurable Hardware, IEEE, pp. 219–225, Apr. 1997.

Oh et al. An Efficient Reed–Solomon Decoder VLSI With Erasure Correction, IEEE, pp. 193–201, May 1997.

Raghupathy et al. Low Power/High Speed design of a Reed Solomon Decoder, IEEE, pp. 2060–2063, Jun. 1997.

Wei et al. High Speed Reed–Solomon Decoder for correcting Errors and Erasures, IEEE, pp. 246–254, Aug. 1993.

Iwaki et al. Architecture of a High Speed Reed–Solomon Decoder, IEEE, pp. 75–81, Jan. 1994.

*Primary Examiner*—Albert De Cady
*Assistant Examiner*—Shelly A Chase
*Attorney, Agent, or Firm*—Bret J. Petersen; Frederick J. Telecky, Jr.

[57] ABSTRACT

The objective of the invention is to offer a Reed-Solomon decoding device in which it is possible to perform decoding calculations at high speed without greatly increasing the circuit scale. The present invention has a decoding calculation input parameter calculator 309 that generates decoding calculation input parameters including syndrome and fail data from a data string, a decoding calculator processing section 304 that performs decoding calculations using the decoding calculation input parameters based on the command codes showing the prescribed decoding calculation operation, and generates decoding calculation output parameters including error value data and error position data, a correction operation implementer 312 that performs correction operations by using the above-mentioned decoding calculation output parameters, and a register B 313 that selectively stores the decoding calculation input parameters output to the decoding calculation processing section 304, and the decoding calculation output parameters that are output to the corrections operation implementer 312.

6 Claims, 8 Drawing Sheets

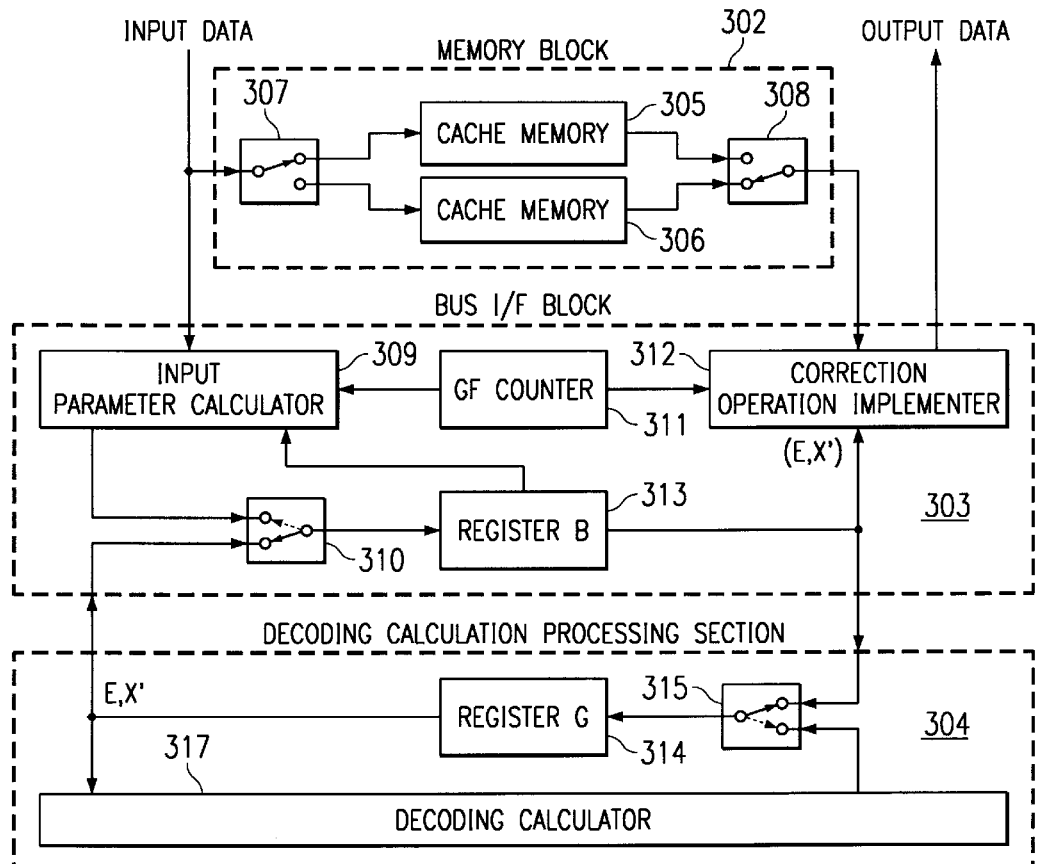
FIG. 3
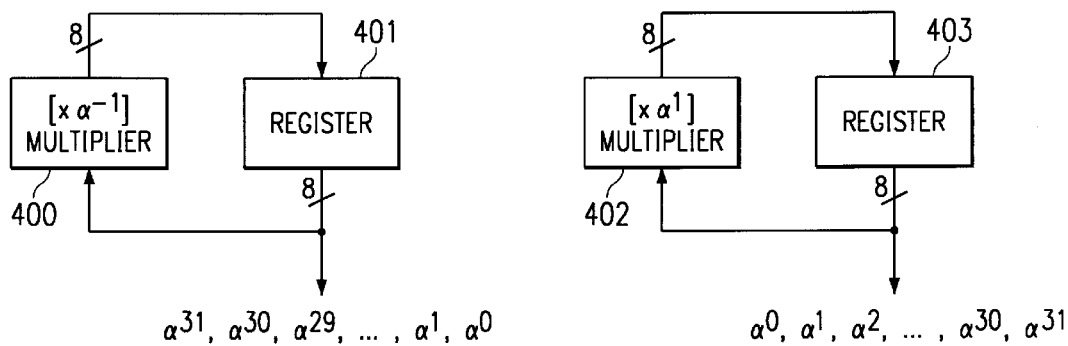
FIG. 4
FIG. 5

REED-SOLOMON DECODING DEVICE

FIELD OF THE INVENTION

This invention relates to a Reed-Solomon decoding device that decodes Reed-Solomon encoded signals that are used for error correction and coding in recording media and digital transmission.

BACKGROUND OF THE INVENTION

The Reed-Solomon Code (hereinafter, RS code) is mainly used for recording media and external coding of digital transmissions, from the appropriateness in relation to the quality of the encoding efficiency and the error burst.

For example, the error correction code that is used with a compact disc is called the CIRC correction code (cross interleaved Reed-Solomon code); this is a product code that is combined with the interleave method. RS (28, 24) code is used as the external code, and RS (32, 28) code as the internal code; these are called the C2 code and the C1 code, respectively. In either code, the RS encoding symbol is constructed of 1 byte, and a single RS decoding block contains a parity check string of 4 bytes.

Generally, the RS code is a check string of 2t symbols, and correction of the t symbol is possible. In the correction of the t symbol, it is necessary to know the t units of error positions, and the value of t units of error corresponding to the respective errors. The RS coding obtains an independent linear formula for 2t units by performing a syndrome calculation at the decoding side in relation to the generation of t units of error. By solving this formula, the error position for the above-mentioned t units, which is an unknown number of 2t units, and the value of the error of the above-mentioned t units corresponding to the respective error positions, can be found.

On the other hand, as for adopting a construction of a product code like the CIRC code, by applying a erasure flag to the RS-coded block for which correction could not be done at the internal RS decoding in relation to the internal code and the RS-encoded block in which the possibility of error correction is comparatively high, a erasure error correction becomes possible in the external RS decoding corresponding to the external code. The erasure symbols for the internal code to which the erasure flags were applied are dispersed in multiple external RS-encoded blocks by means of de-interleaving. In the erasure error correction, by assuming that there is an error present in the above-mentioned erasure symbol, the simultaneous formulas that are obtained from the syndrome calculations are solved. Since the solved error positions are already known, the value of the error for the maximum 2t can be solved. In other words, it is possible to error-correct a maximum of 2t symbols by executing the erasure error correction for the RS codes having check strings for 2t symbols.

The method for the erasure error correction is explained by offering an example of the CIRC code.

In the case of the CIRC code, by applying a erasure flag in the RS decoding (C1 decoding) for the C1 code, which is the internal code, the erasure error correction is possible in the RS decoding (C2 decoding) for the C2 code, which is the external code. Because t=2 in both the C1 code and the C2 code, in C1decoding, correction of a maximum 2 bytes is possible, but in the erasure error correction of the C2 decoding, the correction of a maximum of 4 bytes is possible. The syndrome $s_0$ to $s_3$ and the error value $e_1$ to $e_4$ in the C2 code can be found as follows.

The code-generating polynomial expression Ge (x) for the CIRC code is shown by Formula 1 below.

[Mathematical formula 1]

$$Ge(x) = \prod_{j=0}^{3} (x + \alpha^j) \qquad (1)$$

Here, $\alpha$ is the primitive element for the Galois field. At this time, $s_0$ to $s_3$ obtained by means of the syndrome calculations from the input string have the relationship shown by the following Formula 2 between the above-mentioned $x_1$ to $x_4$, and $e_1$ to $e_4$.

[Mathematical formula 2]

$$
\begin{aligned}
s0 &= e1 + e2 + e3 + e4 \\
s1 &= x1 \cdot e1 + x2 \cdot e2 + x3 \cdot e3 + x4 \cdot e4 \\
s2 &= x1^2 \cdot e1 + x2^2 \cdot e2 + x3^2 \cdot e3 + x4^2 \cdot e4 \\
s3 &= x1^3 \cdot e1 + x2^3 \cdot e2 + x3^3 \cdot e3 + x4^3 \cdot e4
\end{aligned}
\qquad (2)
$$

Here, the symbol "·" indicates multiplication over the Galois field, and the symbol "+" indicates addition over the Galois field. Below, as for the four basic mathematical operations between the elements of a given Galois field, the calculations on that Galois field are shown.

If the error values $e_1$ to $e_4$, which are unknown numbers, are found by solving the simultaneous formulas, the above-mentioned Formula 2 becomes as follows.

First, $e_4$ is obtained as the below listed Formula 3.

[Mathematical formula 3]

$$e4 \leftarrow \frac{s3 + (x1 + x2 + x3) \cdot s2 + (x1 \cdot x2 + x2 \cdot x3 + x3 \cdot x1) \cdot s1 + x1 \cdot x2 \cdot x3 \cdot s0}{(x4 + x1) \cdot (x4 + x2) \cdot (x4 + x3)} \qquad (3)$$

One of the simultaneous equations is reconstructed by substituting the $e_4$ that was obtained in the above-mentioned Formula 2. In other words, as for the Galois field that was used in the CIRC code, by correcting it as in Formula 4 below, noting the fact that the addition and the subtraction are the same, the simultaneous Formula of the above-mentioned Formula 2 is transformed to Formula 5 below.

[Mathematical formula 4]

$$
\begin{aligned}
s0 &\leftarrow s0 + e4 \\
s1 &\leftarrow s1 + x4 \cdot e4 \\
s2 &\leftarrow s2 + x4^2 \cdot e4
\end{aligned}
\qquad (4)
$$

[Mathematical formula 5]

$$
\begin{aligned}
s0 &= e1 + e2 + e3 \\
s1 &= x1 \cdot e1 + x2 \cdot e2 + x3 \cdot e3 \\
s2 &= x1^2 \cdot e1 + x2^2 \cdot e2 + x3^2 \cdot e3
\end{aligned}
\qquad (5)
$$

As for this, the solving of the simultaneous equations is a method that is frequently used when finding the sequence in manual calculations. If $e_3$ is found by solving the simultaneous equation of Formula 5, it becomes like the below listed Formula 6.

[Mathematical formula 6]

$$e3 \leftarrow \frac{s2 + (x1+x2)\cdot s1 + x1\cdot x2\cdot s0}{(x3+x1)\cdot(x3+x2)} \quad (6)$$

By executing the corrections in the same manner, the simultaneous formula of the above-mentioned Formula 5 is modified as in Formulas 7 and 8 below.

[Mathematical formula 7]

$$s0 \leftarrow s0+e3$$
$$s1 \leftarrow s1+x3\cdot e3 \quad (7)$$

[Mathematical formula 8]

$$s0 = e1 + e2$$
$$s1 = x1\cdot e1 + x2\cdot e2 \quad (8)$$

Also, if $e_2$ is found by solving the simultaneous equation of Formula 8, it becomes Formula 9 below.

[Mathematical formula 9]

$$e2 \leftarrow \frac{s1 + x1\cdot s0}{x2 + x1} \quad (9)$$

Next, Formula 10 below is obtained by substituting the $e_2$ that was found in the above-mentioned Formula 8.

[Mathematical formula 10]

$$e1 \leftarrow s0+e2 \quad (10)$$

In this manner, the error values $e_1$ to $e_4$ can be found sequentially.

In the above-mentioned method, in order to distinguish between those which were originally held as information and the calculation operations that were performed at the time of the actual decoding, the symbols "=" and "←" are used in different ways. In other words, the Formulas corresponding to the actual decoding calculations are Formulas 3, 4, 6, 7, 9, and 10, and in the Galois field, at least 23 additions, 17 multiplications, and 3 divisions are necessary.

On the other hand, in the event the erasure error correction is not performed, corrections (double error corrections) can be performed for a maximum of 2 bytes in the C2 decoding. At this time, the error values $e_1$, $e_2$, and the error positions $X'_1$, $X'_2$ are found from the syndromes $s_0$ to $s_3$.

Above, the quadruple erasure error correction, in other words the number of erasure positions, is the decoding calculation process for 4 cases.

Below, an explanation is given in regard to the Reed-Solomon decoding device used in the past.

FIG. 10 is a construction diagram of the Reed-Solomon decoding device used in the past.

As is shown in FIG. 10, the Reed-Solomon decoding device 1 is provided with the memory block 2, the bus I/F block 3, and the decoding calculation processing section 4.

The memory block 2 is provided with the cache memories 5, 6, and the switches 7, 8.

The switch 7 selectively outputs the input data to the cache memories 5, 6. The switch 8 selectively outputs the stored content of the cache memory 5 to the correction operation implementer 12.

The bus I/F block 3 is provided with the input parameter calculator 9, the register $B_{OUT}$ 10, the binary counter 11, the correction operations implementer 12, and the register $B_{IN}$ 13.

The decoding calculation processing section 4 is provided with the switch 14, the register $G_{IN}$ 15, the register $G_{OUT}$ 16, and the decoding calculator 17.

FIG. 11 shows the chronology of the data and the construction elements during the operation of the Reed-Solomon decoding device 1, (A) shows the input data, (B) the output data, (C) the storage condition of the register $B_{OUT}$ 10, (D) the storage condition of the register $B_{IN}$ 13, (E) the storage condition of the register $G_{OUT}$ 16, (F) the storage condition of the register $G_{IN}$ 15, and (G) the processing condition of the decoding calculator 17, respectively.

As is shown in FIG. 11, when the input/output is performed for the input data related to the C1 code at the cache memory 5 of the memory block 2, as for the bus I/F block 3, the calculations are performed for the decoding calculation input parameters at the input parameter calculator 9 for the input data related to the C1 code, and the correction operations are performed by the corrections operation implementer 12. Also, at this time, at the decoding calculations processing section 4, the C2 code processing is performed in regard to the input data related to the C2 code.

Also, when the input/output is performed for the input data related to the C2 code in the cache memory 6, as for the bus I/F block 3, the calculations are performed for the decoding calculations input parameters by the input parameter calculator 9 for the input data related to the C2 code, and the correction operations are performed by the correction operation implementer 12. Also, at this time, at the decoding calculations processing section 4, the C1 decoding process is performed in regard to the input data related to the C1 code.

Here, that which is referred to as the decoding calculation input parameters, basically, is the syndrome (S) and the erasure position (I).

The syndrome (S) is calculated by means of combining the input parameter calculator 9 and the register $B_{OUT}$ 10 shown in FIG. 10.

FIG. 12 is a construction diagram of the input parameter calculator 9 and the register $B_{OUT}$ 10.

As is shown in FIG. 12, the input parameter calculator 9 is provided with the multipliers 24 to 27, the adders 20 to 23, the error flag detector 28, and the distributor 29.

Also, the register $B_{OUT}$ 10 is provided with the registers (30 to 33) and the registers 34 to 37

As for the multipliers 24 to 27, the multiplier coefficients are the multipliers for a Galois field of fixed values, and perform the multiplications of $x\alpha^0$, $x\alpha^1$, $x\alpha^2$, $x\alpha^3$, respectively.

The error flag detector 28 detects whether or not the error flag contained in the input data is a "1."

The distributor 29 outputs and stores the output of the binary counter 11 which operates corresponding to each RS symbol position contained in the input data in any of the registers 34 to 37 of the register $B_{OUT}$ 10.

The storage results of these registers 34 to 37 indicate the erasure positions (I).

The erasure positions (I) are converted to the expression of the Galois field, in other words, from $^i$ to $\alpha^i$ by means of a later presented converter, by the decoding calculator 17 shown in FIG. 10.

Specifically, $I=\{i_1, i_2, i_3, i_4\}$ is converted to $X=\{x_1, x_2, x_3, x_4\}$.

The decoding calculations corresponding to the above-mentioned Formulas 3, 4, 6, 7, and 10 in the case of executing the quadruple erasure error corrections are performed by the decoding calculation processing section 4, and using the decoding calculation input parameters S={$s_0$, $s_1, s_2, s_3\}$ from the register $B_{OUT}$ 10, and the $X=\{x_1, x_2, x_3, x_4\}$ that was obtained by converting the $I=\{i_1, i_2, i_3, i_4\}$, the decoding calculation output parameters $E=\{e_1, e_2, e_3, e_4\}$ and $X'=X=\{x_1, x_2, x_3, x_4\}$ are obtained. In the event the erasure error correction is not performed, in the above-mentioned double error correction, by using the decoding calculation input parameters $S=\{s_0, s_1, s_2, s_3\}$, the decoding calculation output parameters $E=\{e_1, e_2\}$ and $X'=\{x'_1, x'_2\}$ are obtained.

The error positions X for X' are converted to index numbers, in other words, from $\alpha^i$ to i in the later explained converter by the decoding calculation processing section 4. Specifically, $X'=X=\{x_1, x_2, x_3, x_4\}$ is converted to $I=\{i_1, i_2, i_3, i_4\}$, and $X'=\{x'_1, x'_2\}$ is converted to $I'=\{i'_1, i'_2\}$.

FIG. 13 is a construction diagram of the correction operation implementer 12 and the register $B_{IN}$ 13.

As is shown in FIG. 13, the correction operation implementer 12 is provided with the comparator 40, the adder 45, and the logic gate 46.

Also, the register $B_{IN}$ 13 is provided with the registers 41 to 44 and the registers 47 to 50.

The bus I/F block 3 executes the correction operations by using the error value (E) and the error positions (I') that are input from the register $G_{OUT}$ 16.

The binary counter 11 operates according to the switching of the output from the switch pad memories 5, 6 by means of the switches 7, 8, and when the binary count value of the binary counter 11 matches any one of the ($i'_n$) construction elements for the error position (I'), a corresponding error value en is output to the adder 45 from the logic gate 46. Also, at the adder 45, the Galois field calculations are performed in regard to the error value $e_n$ and the data output of the memory block from the switch 8, and the addition results become the output data.

Next, an explanation is given in regard to the decoding calculation processing section 4.

FIG. 14 is a construction diagram of the decoding calculation processing section 4.

As is shown in FIG. 14, the decoding calculation processing section 4 is provided with the microcode ROM 50, the register 51, the destination controller 52, the working register 53, the GLU (Global Logic Unit) 54, and the port selector 55.

As in the CIRC code, t is smaller than 4, and in the event the solution is found directly from the simultaneous formula, and when the processing speed is comparatively slow, a RISC (Reduced Instruction Set Computer) type of device can be used as the decoding calculation processing section 4.

In the decoding calculation processing section 4, each calculation is sequentially performed, and the calculation sets are shared at GLU 54. Also, a series of calculation processes are microcoded, are stored in the microcode ROM 50 as instruction codes, and the process routine (routine for readout from the memory) is controlled by means of the ROM address from the sequencer 51.

Also, during the operation, the calculation results are temporarily stored in the multiple working registers 53 that were initialized beforehand, but as to which working register 53 to store in, this is recorded in the destination control code within the instruction code.

According to this method, the process speed is limited, but along with being able to downsize the device due to sharing of the GLU 54, the freedom of design can be increased due to the microcoding of the calculation processes.

For example, the addition of two elements of the Galois field is equivalent to each bit of an exclusive OR logic operation, and can be realized in one step by the decoding calculations processing section 4. In other words, the GLU 54 includes the function of an exclusive OR logic operation for each bit. However, the multiplication of a Galois field is far more complicated compared to addition, and if an attempt is made to realize this by using ROM, one byte of output is obtained for an address input of two bytes, and the scale becomes extremely large.

An explanation is given in regard to the construction of the GLU 54.

FIG. 15 is a construction diagram of the GLU 54.

As is shown in FIG. 15, the GLU 54 is provided with the operation logic 60, 61, the converters 62, 63, and the operation selector 64.

In the GLU 54, the respective elements of the Galois field for the two input data a, b are converted to the values for the indices for the corresponding original elements, in other words, $\alpha^i$ is converted to i by the converter 62, and additions between the same indices are executed. Then, these addition results that have been obtained are converted to the element for the corresponding Galois field by the converter 63, in other words, i is converted to $\alpha^i$.

For example, the multiplication of $\alpha^v$ and $\alpha^w$ is executed, and in obtaining $\alpha^{v+w}$, the four calculations shown in the following Formula 11 are necessary, and at least four steps are required at the GLU 54.

[Mathematical formula 11]

$$
\begin{aligned}
&1: \quad v \quad \leftarrow \alpha^v \\
&2: \quad w \quad \leftarrow \alpha^w \\
&3: \quad v+w \quad \leftarrow v \cdot w \\
&4: \quad \alpha^{v+w} \quad \leftarrow v+w
\end{aligned}
\tag{11}
$$

Division is also performed in the same manner, and subtraction is executed in place of the addition in the multiplication.

Therefore, in the above-mentioned method, in determining the error values $e_1$ to $e_4$, since the multiplication-division in the above-mentioned Formulas 3, 4, 6, 7, 9, and 10 are done 20 times, even with just this, 80 steps or more become necessary. If the 23 steps of addition are included in this, it becomes a total of more than 103 steps. Because of this, it cannot respond to the requirement of high-speed processing.

In the event t is greater than 4, because the solving of one of the simultaneous equations such as is shown in the above-mentioned Formula 2 is unrealizable, a repeating algorithm such as a Euclidean decoding method is used.

However, in either case, 4 steps are also required in the multiplication and division of the Galois field, and the realization of high-speed processing is difficult.

On the other hand, the requirement for speed in the data reproduction of a CD-ROM at the present time has increased from 2× speed to 12× speed, and the limits for the number of processing steps for error correction is becoming increasingly restricted every da. Furthermore, this means that the reading errors of the optical system are also naturally increasing, and it is desired for the reinforcement of the correction performance by means of the above-mentioned erasure error correction to be strengthened. In other words, it is necessary to realize a higher function with a fewer number of steps.

In realizing C1 decoding and C2 decoding corresponding to 12× speed, for example, if 1 step of the calculations is completed within 1 clock cycle of 16 MHz, it is necessary for the decoding of both C1 and C2 to be executed in 192 steps. Since this condition includes the peripheral processing such as branch processing, it is required for the processing of the core of the C2 decoding to be realized within ¼ of that.

However, in the construction used in the past, for example, when the erasure error correction was performed with C2 decoding, a number of calculations steps of more than 103 were required just in the processing for that correction core, and it could not respond to the requirements of high-speed processing.

Also, in the above-mentioned Reed-Solomon decoding device 1, as is shown in FIG. 10, along with the two registers $B_{OUT}$ 10 and $B_{IN}$ 13 provided in the bus I/F block 3, the two registers $G_{OUT}$ 16 and $G_{IN}$ 15 are provided in the decoding calculation processing section 4. Also, in the Reed-Solomon decoding device 1, because calculations using the erasure position and the error position are performed by the index expression of the Galois field, as is shown in FIG. 15, in the GLU 54 of the decoding calculation processing section 4, the converter 62 that converts the element of the Galois field to the index for the corresponding original space, and the converter 63 that performs its reverse conversion, become necessary.

Because of this, with the Reed-Solomon decoding device 1, there is the problem that it becomes a large-scale device.

This invention was made reviewing the prior technology, and the purpose of this invention is to offer a Reed-Solomon decoding device that accomplishes a downscaling of the circuit.

Also, the purpose of this invention is to offer a Reed-Solomon decoding device in which high-speed processing is possible.

SUMMARY OF THE INVENTION

In order to solve the problems of the above-mentioned prior art, and to achieve the above-mentioned purposes, the Reed-Solomon decoding device of this invention has a decoding calculation input parameter calculating means that generates the decoding calculation input parameters including a syndrome and a erasure position from a data string, a decoding means that performs the decoding calculations by using the decoding calculation input parameters based on the command codes showing the prescribed decoding calculation operations, and generates decoding calculation output parameters including error value data and error position data, a correcting means that performs correction operations by using the above-mentioned decoding calculation output parameters, and a storage means that selectively stores the decoding calculation input parameters that are output to the above-mentioned decoding calculating means, and the decoding calculation output parameters that are output to the above-mentioned correction operation means.

In the Reed-Solomon decoding device of this invention, the processing in the decoding calculation input parameter documenting means and the processing in the correction operation means are not performed at the same time. At this time, because the time at which the decoding calculation input parameters are stored and the time at which the decoding calculation output parameters are stored do not overlap in the storage means, the decoding calculation input parameters and the decoding calculation output parameters can be selectively stored in the storage means.

Also, in the Reed-Solomon decoding device of this invention, preferably, the above-mentioned decoding calculating means is provided with a storage section that selectively stores the decoding calculation input parameters, and the decoding calculation output parameters that are output to the above-mentioned correction operations means.

Also, in the Reed-Solomon decoding device of this invention, preferably, it also has an input/output means that, by switching the input data strings, stores the data words for the C1 code in a first storage means, and stores the data words for the C2 code in a second storage means.

Also, in the Reed-Solomon decoding device of this invention, preferably, when the above-mentioned input/output means is executing the input/output which relates to the data words of the C1 code, the above-mentioned decoding calculation input parameter calculating means generates decoding calculation input parameters relating to the data words of the C1 code, the above-mentioned decoding calculating means performs the decoding calculations relating to the data words of the C2 code, and when the above-mentioned input/output means is executing input/output relating to the data words of the C2 code, the above-mentioned decoding calculation input parameter calculating means generates decoding calculation input parameters relating to the data words of the C2 code, and the above-mentioned decoding calculating means performs decoding calculations relating to the data words of the C1 code.

Also, the Reed-Solomon decoding device of this invention preferably also has a Galois field counter that outputs the symbol positions of the above-mentioned data strings sequentially to the above-mentioned correction operating means.

Also, the Reed-Solomon decoding device of this invention preferably is a multiplier that performs the multiplication of the 1st group of elements $\alpha^w$: $(A_{w,\ i-1}, A_{w,\ i-2}, A_{w,\ i-3}, \ldots, A_{w,\ 3}, A_{w,\ 2}, A_{w,\ 1}, A_{w,\ 0})^T$ and the 2nd group of elements $\alpha^v$: $(A_{v,\ i-1}, A_{v,\ i-2}, A_{v,\ i-3}, \ldots, A_{v,\ 3}, A_{v,\ 2}, A_{v,\ 1}, A_{v,\ 0})^T$ of the Galois field GF ($2^i$), respectively; and has a multiplier that is provided with i units of multiplier sections that perform the parallel multiplication of the above-mentioned first element, and $\alpha^0, \alpha^1, \alpha^2, \alpha^3, \ldots, \alpha^{i-3}, \alpha^{i-2}, \alpha^{i-1}$ of the primitive element $\alpha$ of the above-mentioned Galois field, and i units of logic product calculating sections that perform in parallel the logic product calculations for the multiplication results of the above-mentioned i units of multiplying sections and the above-mentioned $A_{v,\ 0}, A_{v,\ 1}, A_{v,\ 2}, A_{v,\ 3} \ldots, A_{v,\ i-3}, A_{v,\ i-2}, A_{v,\ i-1}$, respectively, and an adder section that adds the calculation results of the above-mentioned i units of logic product calculating sections.

Lastly, the Reed-Solomon decoding device of this invention preferably is a multiplier that performs the multiplication of the 1st group of elements $\alpha^w$: $(A_{w,\ i-1}, A_{w,\ i-2}, A_{w,\ i-3}, \ldots, A_{w,\ 3}, A_{w,\ 2}, A_{w,\ 1}, A_{w,\ 0})^T$ and the 2nd group of elements $\alpha^v$: $(A_{v,\ i-1}, A_{v,\ i-2}, A_{v,\ i-3}, \ldots, A_{v,\ 3}, A_{v,\ 2}, A_{v,\ 1}, A_{v,\ 0})^T$ of the Galois field GF ($2^i$) of the Galois field GF ($2^i$), respectively; and has a multiplier that is provided with i units of logic product calculating sections that perform in parallel the logic product calculations for the multiplication results of the above-mentioned 1st group of elements and the above-mentioned $A_{v,\ 0}, A_{v,\ 1}, A_{v,\ i-2}, A_{v,\ i-3}, \ldots, A_{v,\ 3}, A_{v,\ 2}, A_{v,\ 1}$, respectively; i units of multiplier sections that perform the parallel multiplication of the calculation results of the above-mentioned logic product calculating sections and $\alpha^0, \alpha^1, \alpha^2, \alpha^3, \ldots, \alpha^{i-3}, \alpha^{i-2}, \alpha^{i-1}$, of the primitive element $\alpha$ of the above-mentioned Galois field, and an adder section that adds the calculation results of the above-mentioned i units of multiplying sections.

BRIEF DESCRIPTION OF THE DRAWINGS

FIG. 1 is a construction diagram of the multiplier circuit for a Galois field related to an embodiment of this invention.

FIG. 2 is a construction diagram of another multiplier circuit for a Galois field related to an embodiment of this invention.

[FIG. 3]

FIG. 3 is a construction diagram of a Reed-Solomon decoding device related to an embodiment of this invention.

[FIG. 4]

FIG. 4 is a construction diagram of one example of the GF counter shown in FIG. 3.

[FIG. 5]

FIG. 5 is a construction diagram of another example of the GF counter shown in FIG. 3.

FIG. 6 is a drawing showing the chronology of the data and the construction elements during operation of the Reed-Solomon decoding device shown in FIG. 3.

FIG. 7 is a construction diagram of the input parameter calculator, the switch, and the register shown in FIG. 3.

FIG. 8 is a construction diagram of the correction operation implementer shown in FIG. 3.

FIG. 9 is a construction diagram of the GLU of the decoding calculation processing section shown in FIG. 3.

FIG. 10 is a construction diagram of a Reed-Solomon decoding device used in the past.

FIG. 11 shows the chronology of the data and the construction elements during the operation of the Reed-Solomon decoding device 1, (A) shows the input data, (B) the output data, (C) the storage condition of the register $B_{OUT}$, (D) the storage condition of the register $B_{IN}$, (E) the storage condition of the register $G_{OUT}$, (F) the storage condition of the register $G_{IN}$, and (G) the processing condition of the decoding calculator, respectively.

FIG. 12 is a construction diagram of the input parameter calculator and register shown in FIG. 10.

FIG. 13 is a construction diagram of the correction operation implementer and register shown in FIG. 10.

FIG. 14 is a construction diagram of the decoding calculation processing section shown in FIG. 10.

FIG. 15 is a construction diagram of the GLU shown in FIG. 14.

REFERENCE NUMERALS AND SYMBOLS AS SHOWN IN THE DRAWINGS

Figure 1:
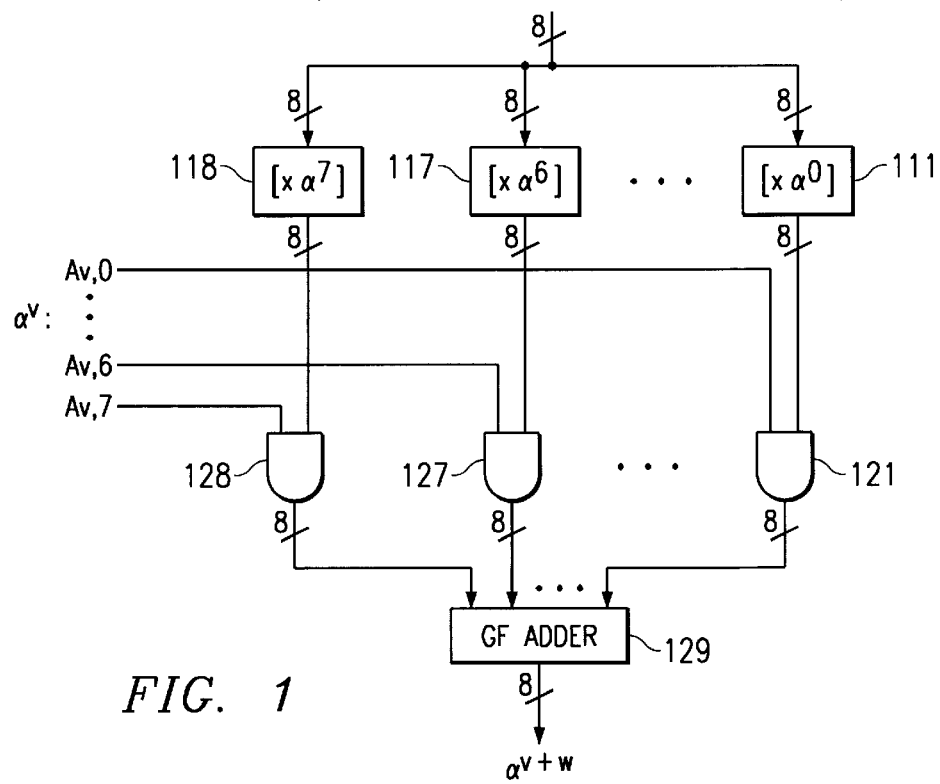
[FIG. 1]

110, 130 represents a multiplier, 301 a Reed-Solomon decoding device, 302 a memory block, 303 a bus I/F block, 304 a decoding calculation processing section, 309 an input parameter calculator, 311 a GF counter, 312 a correction operation implementer, 314 a register, and 17 is a decoding calculator.

DESCRIPTION OF EMBODIMENTS

Below, an explanation is given in regard to a Reed-Solomon decoding device relating to embodiments for this invention.

One direct method that realizes high-speed processing is realizing the multiplication-or division of a Galois field in 1 step. This can be realized with ROM, but the fact that this becomes a fairly large device (a capacity of 64 kilobytes, respectively) was previously mentioned. However, in regard to multiplication, a high-speed calculating circuit can be realized with about 300 gates by utilizing its uniformity.

As one example, the case in which i=8 in a Galois field GF ($2^i$) is shown.

First, using the primitive element of the Galois field GF($2^8$) as α, the arbitrary element $α^v$ can be expressed as in the following Formulas 12 and 13.

[Mathematical formula 12]

$$\alpha^v = \sum_{i=0}^{7} Av \cdot i\alpha^i \quad (12)$$

[Mathematical formula 13]

$$(\alpha^v) = (Av.7\ Av.6\ \ldots\ Av.1\ Av.0)^T \quad (13)$$

Here, $A_{v,\,i}$=0 or 1, and v is an arbitrary integer. Also, ($α^v$) shows the row vector expression for the element $α^v$, and ($\ldots$)$^T$ shows the transposed matrix.

Here, the calculation of the arbitrary element $α^v$ of the above-mentioned Galois field and the $α^w$: ($A_{w,\,7}\,A_{w,\,6}\ldots A_{w,\,1}\,A_{w,\,0}$)$^T$ is considered. Formula 14 below is established from the above-mentioned Formula 13.

[Mathematical formula 14]

$$\alpha^{v+w} = \alpha^v \cdot \alpha^w \quad (14)$$

$$= \left\{\sum_{i=0}^{7} Av, i\alpha^i\right\} \cdot \alpha^w$$

$$= \sum_{i=0}^{7} Av, i\alpha^i \cdot \alpha^w$$

This Formula 14 is expressed as a row vector, and obtains Formula 15 below.

[Mathematical formula 15]

$$(\alpha^{v+w}) = \sum_{i=0}^{7} Av, i\ [x\alpha^i](\alpha^w) \quad (15)$$

Here, [X $α^i$] is a matrix that is equivalent to multiplying $α^i$, and is an 8×8 matrix. In other words, Formula 16 below is established.

[Mathematical formula 16]

$$[x\alpha^i](\alpha^w) = (\alpha^{i+w}) \quad (16)$$

Specifically, Formulas 18 and 19 below are established from the field generation polynomial shown in Formula 17 below for the Galois field of the CIRC code.

[Mathematical formula 17]

$$Gp(x) = x^8 + x^4 + x^3 + x^2 + 1 \quad (17)$$

[Mathematical formula 18]

$$[x\alpha] = \begin{pmatrix} 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 1 & 0 & 0 & 0 & 1 & 0 & 0 & 0 \\ 1 & 0 & 0 & 0 & 0 & 1 & 0 & 0 \\ 1 & 0 & 0 & 0 & 0 & 0 & 1 & 0 \\ 0 & 0 & 0 & 0 & 0 & 0 & 0 & 1 \\ 1 & 0 & 0 & 0 & 0 & 0 & 0 & 0 \end{pmatrix} \quad (18)$$

[Mathematical formula 19]

$$[x\alpha^i] = [x\alpha]^i \quad (19)$$

From the above-mentioned Formula 15, the multiplier circuit of the Galois field, as is shown in FIG. 1, from among the two inputs ($\alpha^w$, $\alpha^v$), the one in which $\alpha^0$ to $\alpha^7$ is multiplied by the multipliers 111 to 118 in one of the elements, are gated by means of one of the AND Gates 121 to 128 to which each of the other bits are input, an output of 8 units of 8 bytes is obtained, and the addition of these (the exclusive OR logic operations for each bit) can be realized by a construction that calculates by means of the GF adder 129.

The multiplier circuits respectively corresponding to the [$X\alpha^0$] to [$X\alpha^7$] from the above-mentioned Formulas 18 and 19 can be realized by executing the respective 3 to 21 units of an exclusive OR logic operation and a multiplier circuit for the Galois field with a total of about 300 gates.

The delay amount for this multiplier circuit units is, for example, less than 10 nsec, and processing is sufficiently possible in one clock cycle of 16 MHz.

Now then, the above-mentioned Formula 15 can be modified as in the below listed Formula 20.

[Mathematical formula 20]

$$(\alpha^{v+w}) = \sum_{i=0}^{7} Av, i \ [x\alpha^i](\alpha^w) \quad (20)$$

$$= \sum_{i=0}^{7} [x\alpha^i](Av, i(\alpha^w))$$

Figure 2:
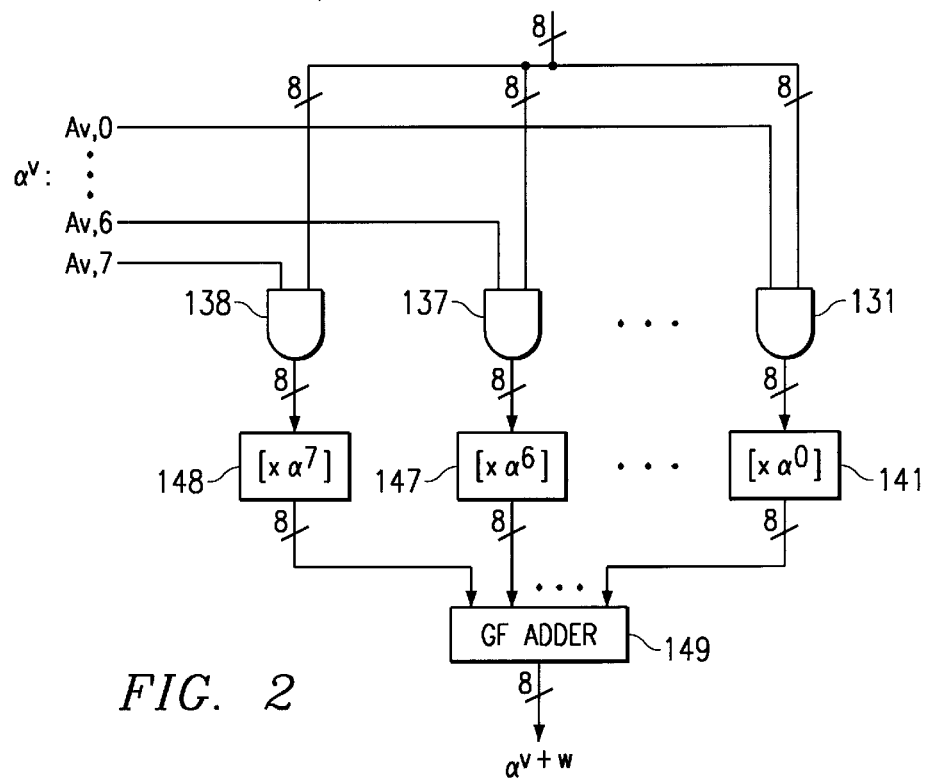
[FIG. 2]

In response to this, as for the multiplier circuit for the Galois field, it is also possible to arrange AND gates on the input side as in FIG. 2. In other words, the AND for the two inputs ($\alpha^w$, $\alpha^v$) are provided by means of the AND gates 131 to 138, and as a result of this, a device that multiplies $\alpha^0$ to $\alpha^7$ can be realized by means of the multipliers 141 to 148, and an adding structure via the GF adder 129.

In regard to the division for the Galois field, first, after the inverse element is found for the element on the division side, multiplication of the element on the division side is executed by the above-mentioned multiplier circuit. In other words, it comes to require 2 steps. In finding the above-mentioned inverse element, since this can be done by obtaining an output of 8 bits, this can be realized with a ROM with a capacity of 256 bytes. This is equivalent to, for example, 500 gates, and does not have that much of an impact on the circuit scale.

From the above, with a circuit of 800 gates, the multiplication becomes executable in 1 step, and the division in 2 steps, respectively, for a Galois field. By this means, for the above-mentioned Formulas 3, 4, 6, 7, 9, and 10, the 17 multiplications can be realized in 17 steps, the 3 divisions in 6 steps, and it can be realized with a total of 46 steps, including the 23 steps of addition. In other words, it can be realized with a number of steps which is less than half than in the past.

In the Reed-Solomon decoding device of this embodiment configuration, the multiplier 110 shown in the FIG. 1 or the multiplier 130 shown in FIG. 2 is used in the GLU for the decoding calculation processing section.

Also, in the Reed-Solomon decoding device of this embodiment configuration, due to the fact that a Galois field counter that sequentially outputs the elements of the Galois field is used instead of a binary counter, along with simplifying the construction of the GLU for the decoding calculation processing section, the scale of the registers for the bus I/F block and the decoding calculation processing section can also be reduced.

Below, a detailed explanation is given in regard to the construction of the Reed-Solomon decoding device related to this embodiment.

FIG. 3 is a construction diagram of the Reed-Solomon decoding device 301 related to this embodiment.

As is shown in FIG. 3, the Reed-Solomon decoding device 301 is provided with the memory block 302, the bus I/F block 303, and the decoding calculation processing section 304.

The memory block 302 is provided with the cache memories 305, 306 and the switches 307, 308.

The switch 307 selectively outputs the input data to the cache memories 305, 306. The switch 308 selectively outputs the storage contents of the cache memory 305 to the correction operations implementer 312.

The bus I/F bloc 303 is provided with the input parameter calculator 309, the switch 310, the GF counter 311, the correction operations implementer 312, and the register 313.

Figure 10:
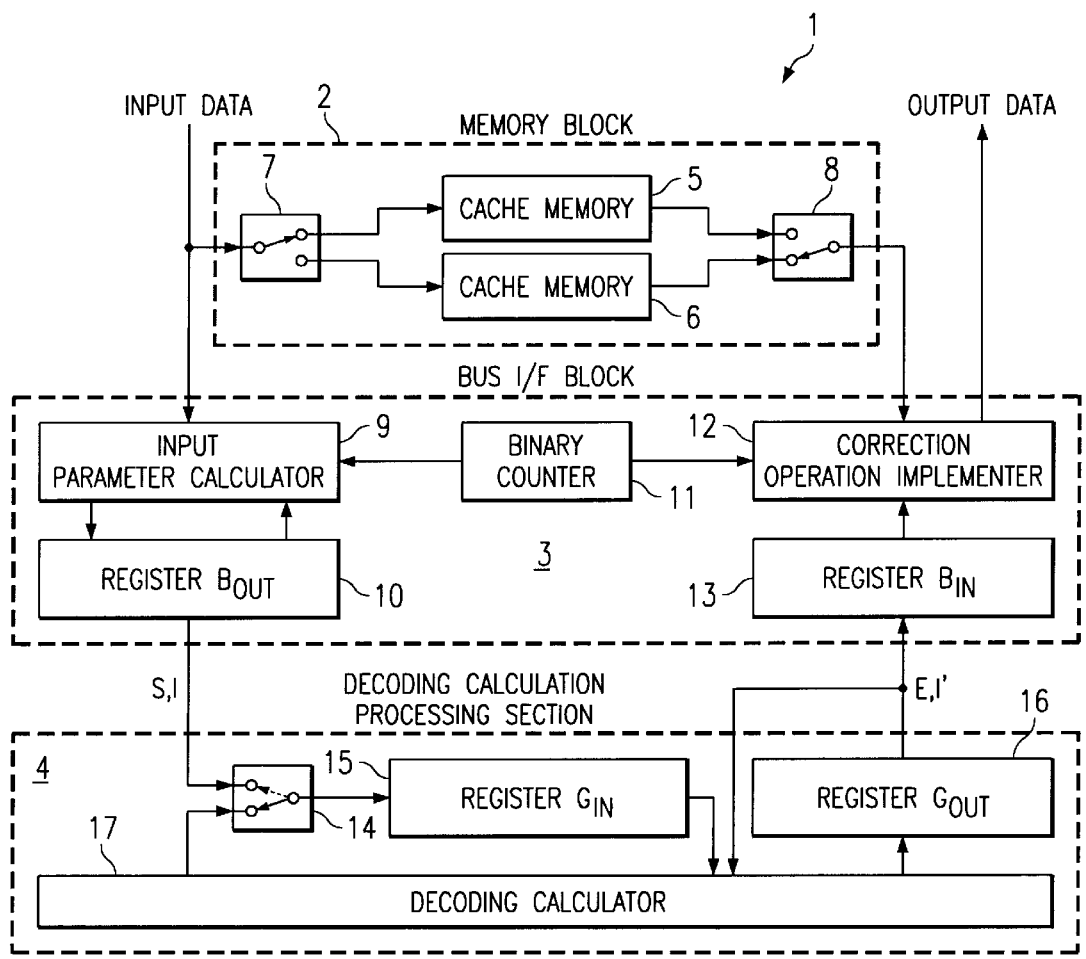
[FIG. 10]
Figure 11:
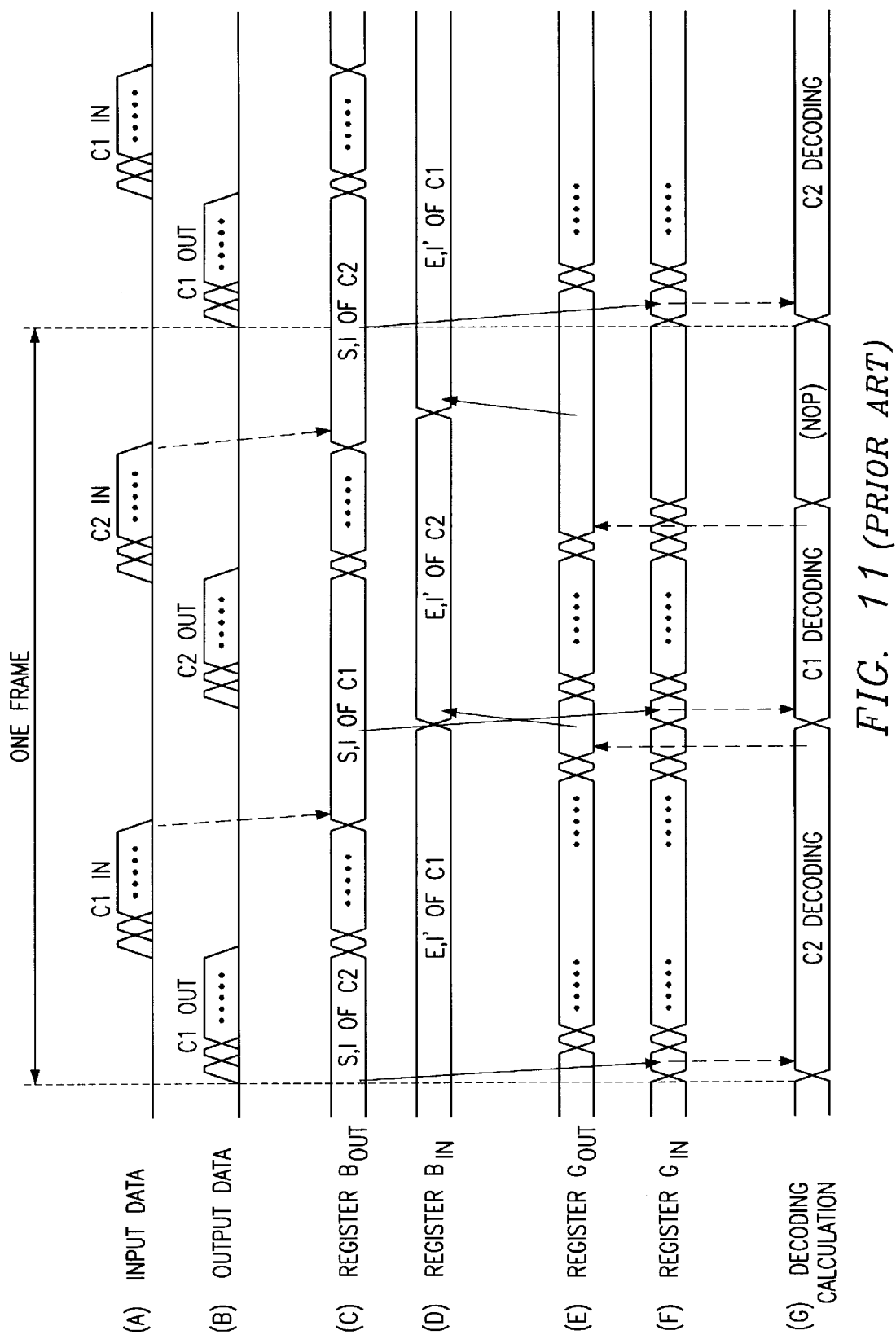
[FIG. 11]
Figure 12:
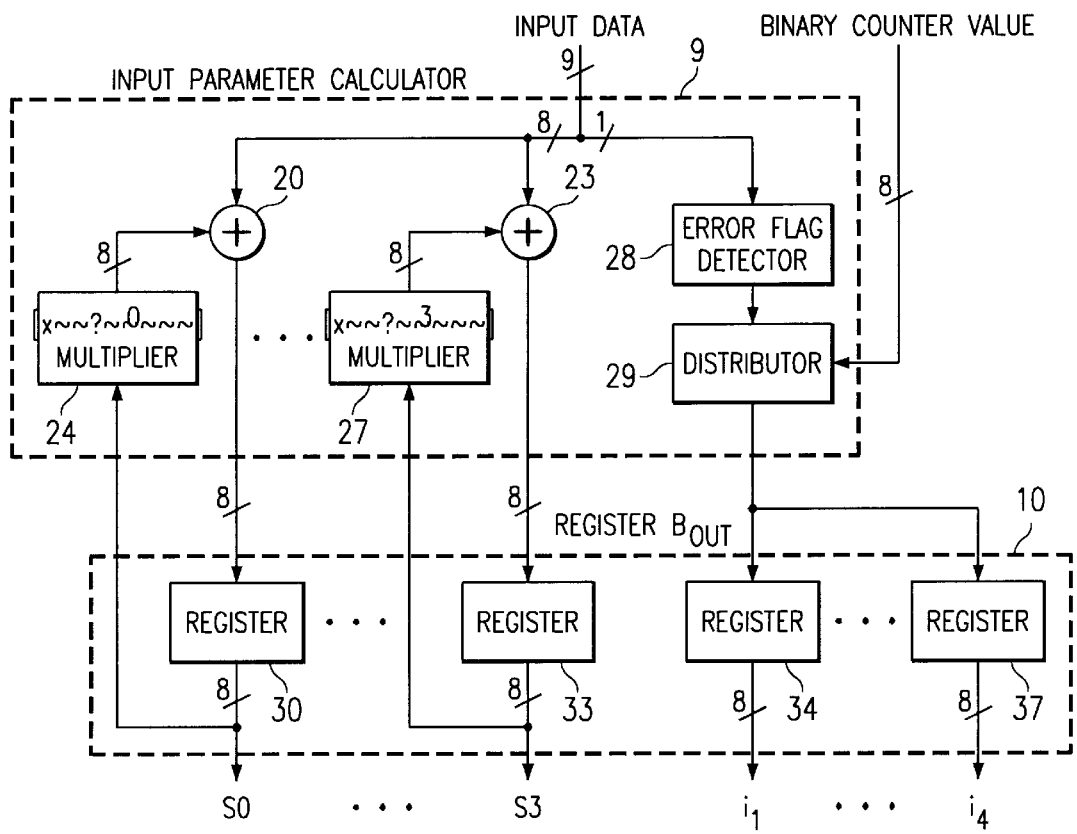
[FIG. 12]
Figure 13:
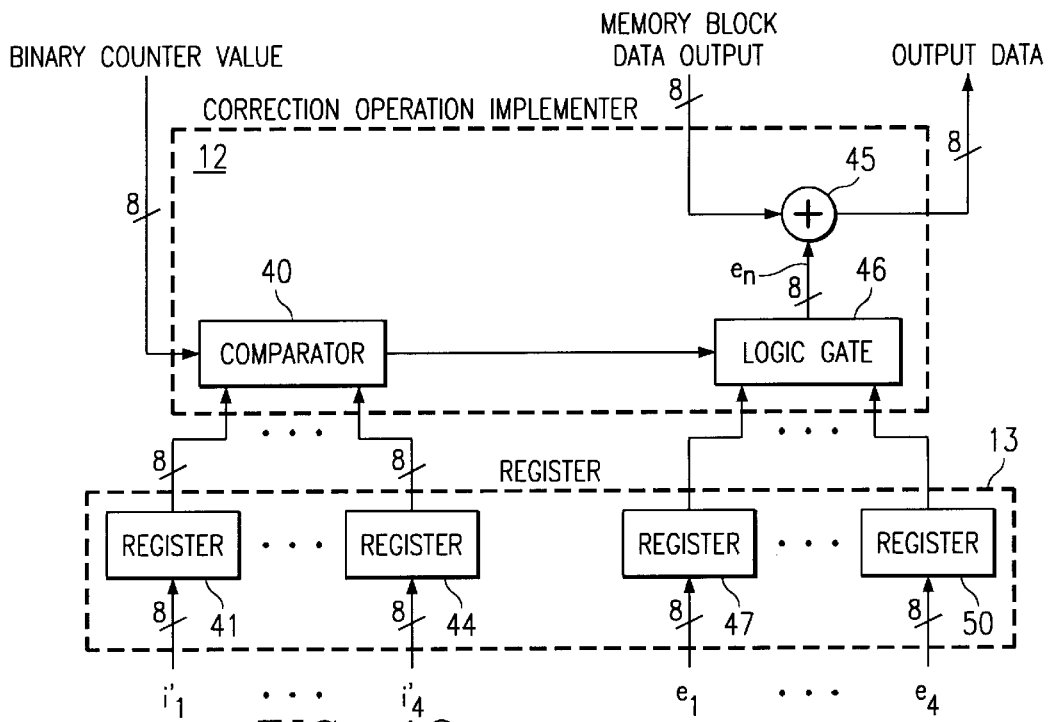
[FIG. 13]

Here, the GF counter 311 is provided instead of the binary counter 11 shown in FIG. 10, and is a Galois field counter that sequentially outputs the elements of the Galois field. For example, when the input/output for the Reed-Solomon decoding device 301 is in the direction from the MSB (Most Significant Bit) to the LSB (Least Significant Bit) of the RS code, the GF counter 311, as is shown in FIG. 4, can be constructed of the $\alpha^{-1}$ coefficient multiplier 400 and the register 401. In this case, for example, $\alpha^{31}$ is applied as the initial value.

Also, when the input/output for the Reed-Solomon decoding device 301 is in the direction of from the LSB to the MSB of the RS code, the GF counter 311, as is shown in FIG. 5, can be constructed of the $\alpha^1$ coefficient multiplier 402 and the register 403.

The decoding calculation operating section 304 is provided with the register 314, the switch 315, and the decoding calculator 317.

Figure 6:
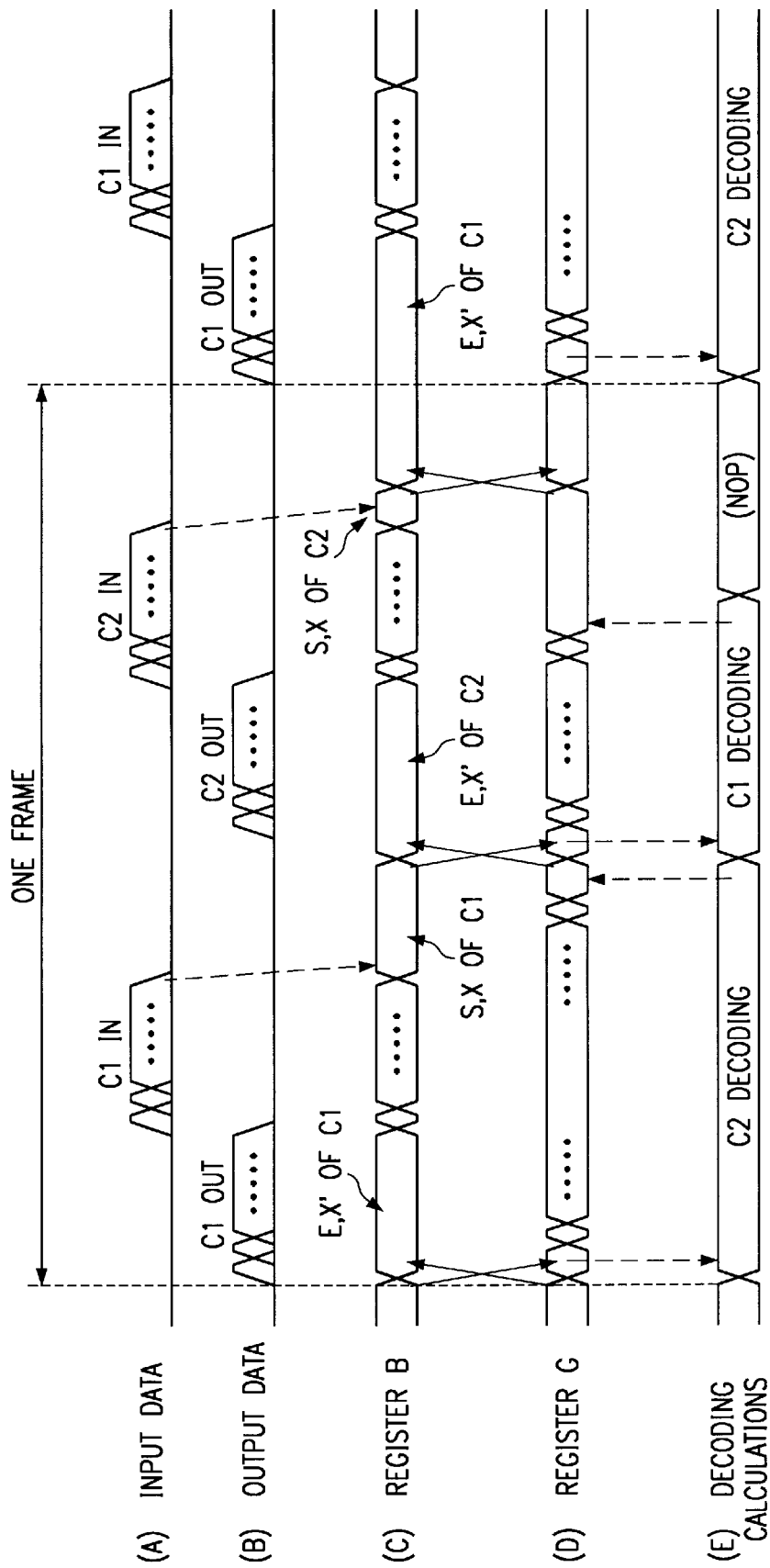
[FIG. 6]

FIG. 6 shows the chronological condition of the data and the construction elements during operation of the Reed-Solomon decoding device 301, (A) shows the input data, (B) the output data, (C) the storage condition of the register B 313, (D) the storage condition of the register G 314, and (E) the processing condition of the decoding calculator 317, respectively.

Figure 7:
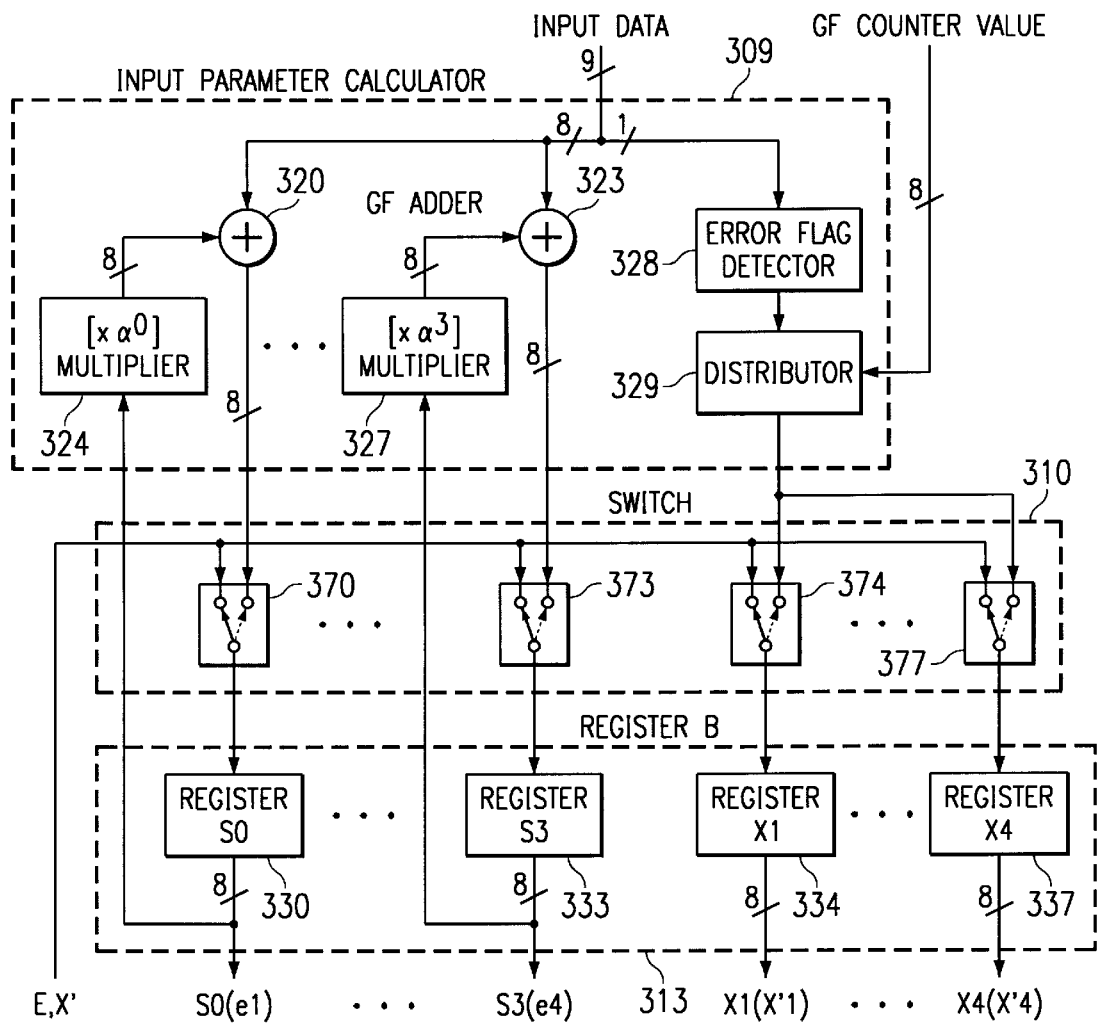
[FIG. 7]

As is shown in FIG. 6, when input/output is performed for the input data related to the C1 code in the cache memory 305 of the memory block 302, the syndrome (S) and the erasure position (X) are totaled. At this time, the selection of the switch 310 shown in FIG. 3 and FIG. 7 is at the position shown by the dotted line arrow. Also, at this time, the decoding calculation operating section 304 is performing the G2 decoding, and the selection of the switch 315 shown in FIG. 3 is at the position shown by the dotted line arrow. Also, the register 314 is operating as a working register.

When the C2 decoding is completed, the error value (E) and the error position (X'), which are the decoding calculation output parameters for the correction operation for the C2 code, are input to the register 314. When the inputting of the decoding calculation input parameters for the above-mentioned C1 has ended, and the C2 decoding has ended, the switch 310 and the switch 315 of FIG. 3 are switched to the positions of the solid line arrows, and the respective data is converted. Specifically, the decoding calculation input parameters for C1 are output from the register 313 to the decoding calculator 317, the error value (E) and the error position (X') for the C2 code are input from the register 314 to the register 313, and correction of the C2 code is performed by means of the correction operation implementer 312.

In this manner, in the bus I/F block 303, the fact that the processes in the input parameter calculator 309 and the correction operation implementer 312 are not performed at the same time is utilized, the register 313 is used for both the decoding calculation input parameters and the decoding calculation output parameters, and a reduction of the circuit scale is achieved.

Here, that which is referred to as the decoding calculation input parameters, specifically, are the syndrome (S) and the erasure position (X).

FIG. 7 is a construction diagram of the input parameter calculator 309, the switch 310, and the register 313.

As is shown in FIG. 7, the input parameter calculator 309 is provided with the multipliers 324 to 327, the adders 320 to 323, the error flag detector 328, and the distributor 329. The GF counter values are input from the GF counter 311 shown in FIG. 3.

As for the multipliers 324 to 327, the calculator coefficients are multipliers for a Galois field of a fixed value, and perform the multiplication of $X\alpha^0$, $X\alpha^1$, $X\alpha^2$, $X\alpha^3$.

The error flag detector 328 detects whether or not the error flag contained in the input data is a "1."

The distributor 329 distributes and outputs the output of the GF counter 311 that operates corresponding to each RS symbol position contained in the input data to any of the registers 334 to 337 of the register B 313, and stores it.

Also, switch 310 is provided with switches 370 to 377. The switches 370 to 373 selectively output the error value (E) and the error position (X') from the decoding calculator 317, and the output from the adders 320 to 323, to the registers 330 to 333. The switches 374 to 377 selectively output E, X' from the decoding calculator 317, and the output from the distributor 329, to the registers 334 to 337.

The register 313 is provided with the registers 330 to 333 and registers 334 to 337.

Since the erasure position (X) is an expression of the Galois field, as for the decoding calculator processing section 304, it is not necessary to provide a converter that converts from i to $\alpha^i$.

The decoding calculations corresponding to the above-mentioned Formulas 3, 4, 6, 7, and 10 for the case of executing the quadruple erasure error correction, is executed at the decoding calculation processing section 304, and by using the decoding calculation input parameters $S=\{s_0, s_1, s_2, s_3\}$ and $X=\{x_1, x_2, x_3, x_4\}$ from the register 313, obtains the decoding calculation output parameters $E=\{e_1, e_2, e_3, e_4\}$ and $X'=X=\{x_1, x_2, x_3, x_4\}$. In the event the erasure error correction is not performed, by using the decoding calculation input parameters $S=\{s_0, s_1, s_2, s_3\}$ at the above-mentioned double error correction, the decoding calculation output parameters $E=\{e_1, e_2\}$ and $X'=\{x'_1, x'_2\}$ are obtained.

Here, the error position X or a X' can be used as is in the correction operation. Therefore, as for the decoding calculations processing section 304, it is not necessary to provide a converter that converts from $\alpha^i$ to i.

Figure 8:
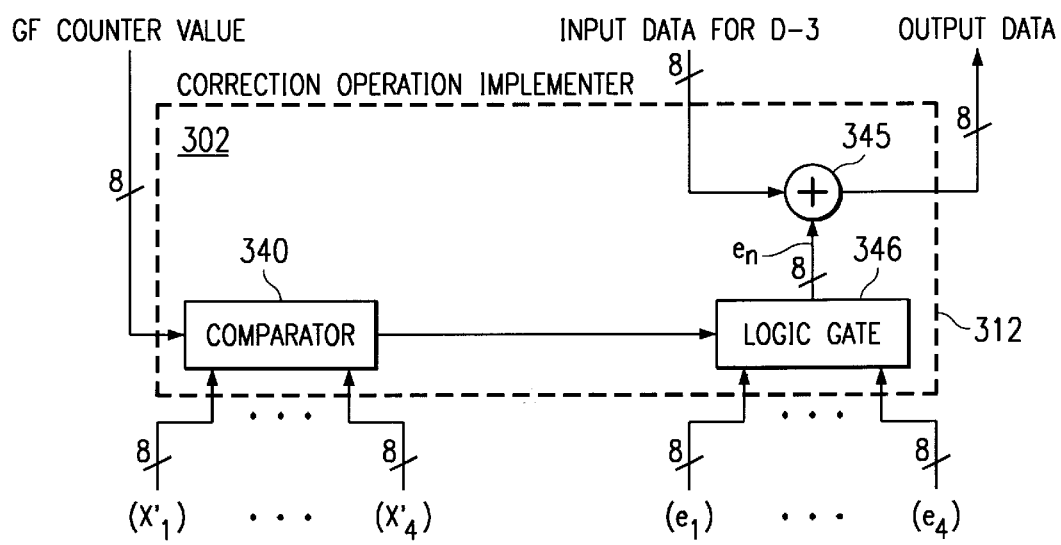
[FIG. 8]

FIG. 8 is a construction diagram of the correction operation implementer 312.

As is shown in FIG. 8, the correction operation implementer 312 is provided with the comparator 340, the adder 345, and the logic gate 346.

The GF counter 311 shown in FIG. 3 operates corresponding to switching the outputs from the cache memories 305, 306 by means of the switches 307, 308, and when the GF counter value of the GF counter 311 matches any $(x'_n)$ of the construction elements of the error position (X'), a corresponding error value $e_n$ from the logic gate 346 is output to the adder 345. Also, at the adder 345, Galois field addition is performed in regard to the error value $e_n$, and the input data from the bus I/F block 303 and the addition results become the output data (correction has been performed).

Figure 14:
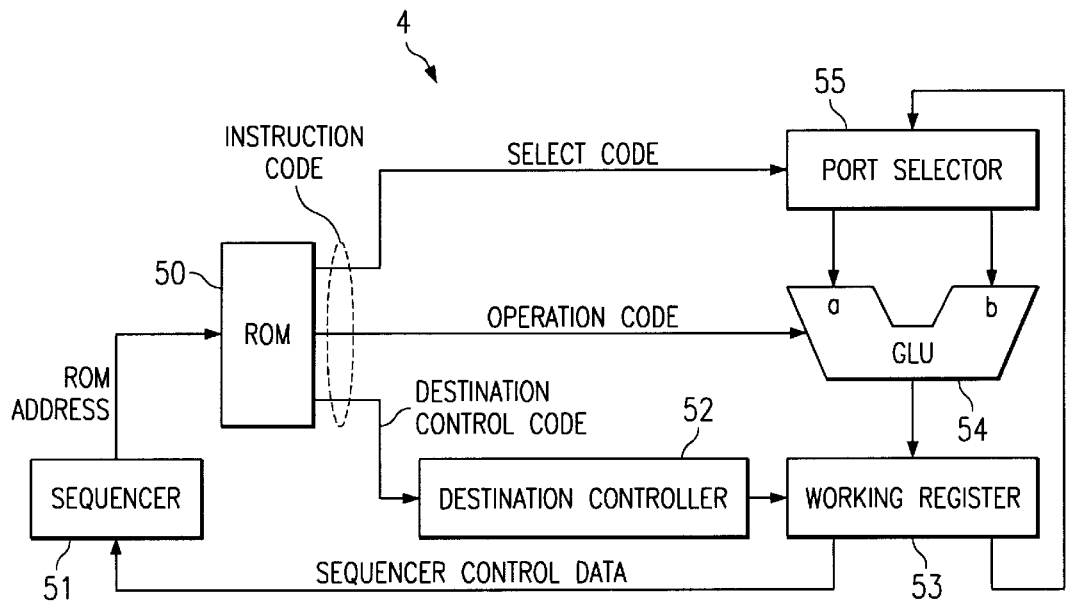
[FIG. 14]

The construction of the decoding calculation processing section 304 is the same as the construction of the decoding calculation processing section 4 shown in FIG. 14. However, the construction of the GLU of the decoding calculation processing section 304 is different than that of the GLU 54.

Figure 9:
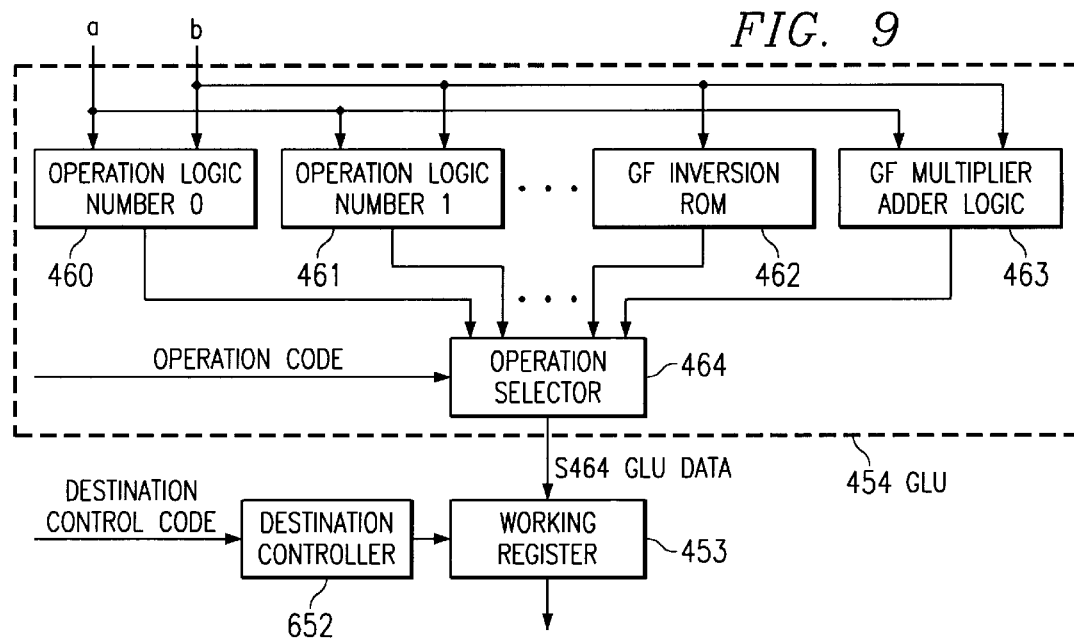
[FIG. 9]

FIG. 9 is a construction diagram of the GLU 454 of the decoding calculation processing section 304.

As is shown in FIG. 9, the GLU 454 is provided with the operation logic 460, 461, the GF inversion ROM 462, the GF multiplier adder logic (463), and the operation selector (464).

Here, the multiplier 110 shown in FIG. 1 or the multiplier 130 shown in FIG. 2 is used in the GF multiplier adding logic 463. Because of that, the number of steps in the decoding calculation process can be greatly reduced, and the decoding calculation process can be performed in a short time.

Figure 15:
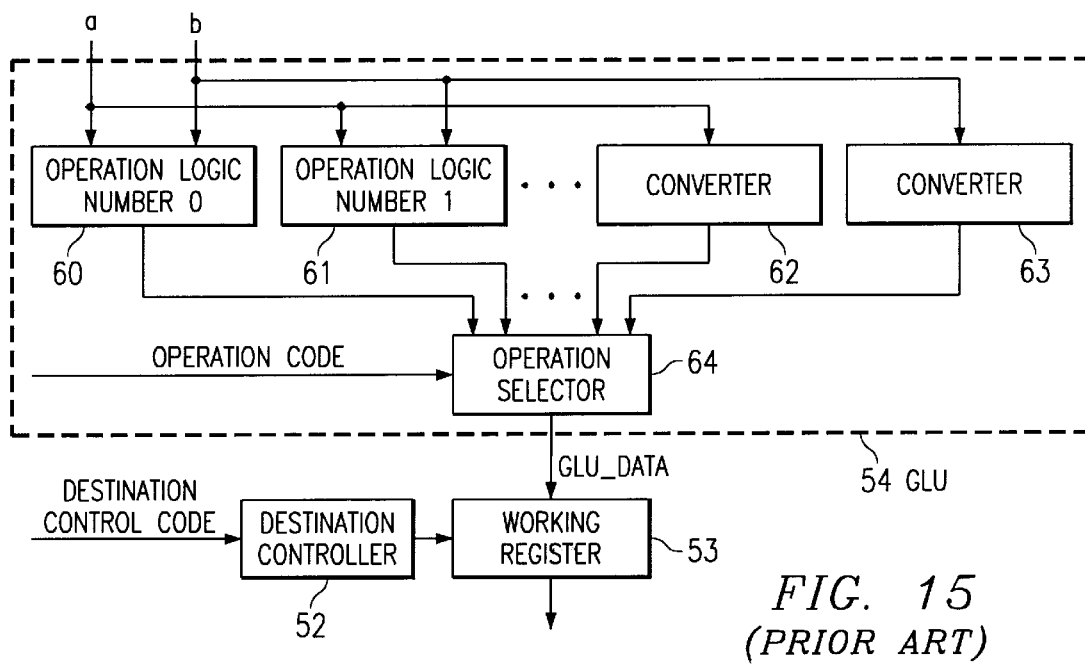
[FIG. 15]

Also, the necessity to provide the converters 62, 63 such as are shown in FIG. 15 is eliminated, and a reduction of the circuit scale can be designed.

Above, an explanation was given in regard to a CIRC code of t=2, but this invention can be applied even in the case of using the Euclidean code method, the Berlekamp-Massey method, or the like, in which the value of t is large.

As was explained above, according to the Reed-Solomon decoding device of this invention, a reduction in the scale of the device can be accomplished.

Also, according to the Reed-Solomon decoding device of this invention, the decoding calculation process can be performed in a short time.

What is claimed is:

1. A Reed-Solomon decoding device comprising:

a decoding calculation input parameter calculating means that generates the input parameters used in decoding calculations, including a syndrome and an erasure position from a data string, a decoding means that performs the decoding calculations by using the decoding calculation input parameters based on the command codes providing the prescribed decoding calculation operations, and generates decoding calculation output parameters including error value data and error position data, a correcting means that performs correction operations by using the decoding calculation output parameters, a storage means that selectively stores the decoding calculation input parameters that are output to the decoding calculating means, and the decoding calculation output parameters that are output to the correction operation means, and an input/output means that switches the input data string, stores the data words for a C1 code in a first storage section, and stores the data words for a C2 code in a second storage section;

wherein during the execution of the input/output relating to the data words of the C1 code by the input/output means, the decoding calculation input parameter calculating means generates decoding calculation input parameters relating to the data words of the C1 code, and the decoding calculating means performs decoding calculations relating to the data words of the C2 code, and during the execution of the input/output relating to the data words for the C2 code by the output means, the decoding calculation input parameter calculating means generates the decoding calculation input parameters relating to the data word for the C2 code, and the decoding calculating means performs the decoding of groups relating to the data words or the C1 code.

2. The Reed-Solomon decoding device of claim 1 further comprising:

a Galois field counter that outputs the symbol position of the data string sequentially to the correction operating means.

3. The Reed-Solomon device of claim 2 wherein the decoding calculating means is a multiplier that performs the multiplication of the 1st group of elements $\alpha^w$: $(A_{w,\,i-1}, A_{w,\,i-2}, A_{w,\,i-3}, \ldots, A_{w,\,3}, A_{w,\,2}, A_{w,\,1}, A_{w,\,0})^T$ and the 2nd group of elements $\alpha^v$: $(A_{v,\,i-1}, A_{v,\,i-2}, A_{v,\,i-3}, \ldots, A_{v,\,3}, A_{v,\,2}, A_{v,\,1}, A_{v,\,0})^T$ of the Galois field GF $(2^i)$, respectively; and has a multiplier that is provided with i units of multiplier sections that perform the parallel multiplication of the first element, and $\alpha^0$, $\alpha^1, \alpha^2, \alpha^3, \ldots, \alpha^{i-3}, \alpha^{i-2}, \alpha^{i-1}$, of the primitive element $\alpha$ of the Galois field, and i units of logic product calculating sections that perform in parallel the logic product calculations for the multiplication results of the i units of multiplying sections and the $A_{v,\,0}, A_{v,\,1}, A_{v,\,2}, A_{v,\,3}, \ldots, A_{v,\,i-3}, A_{v,\,i-2}, A_{v,\,i-1}$, respectively; and an adder section that adds the calculation results of the i units of logic product calculating sections.

4. The Reed-Solomon device of claim 2 wherein the decoding calculating means is a multiplier that performs the multiplication of the 1st group of elements $\alpha^w$: $(A_{w,\,i-1}, A_{w,\,i-2}, A_{w,\,i-3}, \ldots, A_{w,\,3}, A_{w,\,2}, A_{w,\,1}, A_{w,\,0})^T$ and the 2nd group of elements $\alpha^v$: $(A_{v,\,i-1}, A_{v,\,i-2}, A_{v,\,i-3}, \ldots, A_{v,\,3}, A_{v,\,2}, A_{v,\,1}, A_{v,\,0})^T$ of the Galois field GF (2i), respectively; and has a multiplier that is provided with i units of logic product calculating sections that perform in parallel the logic product calculations for the multiplication results of the 1st group of elements and the $A_{v,\,0}, A_{v,\,1}, A_{v,\,2}, A_{v,\,3}, \ldots, A_{v,\,i-3}, A_{v,\,i-2}, A_{v,\,i-1}$, respectively; i units of multiplier sections that perform the parallel multiplication of the calculation results of the logic product calculating sections and $\alpha^0, \alpha^1, \alpha^2, \alpha^3, \ldots, \alpha^{i-3}, \alpha^{i-2}, \alpha^{i-1}$, of the primitive element $\alpha$ of the Galois field, and an adder section that adds the calculation results of the i units of multiplying sections.

5. The Reed-Solomon device claim 1 wherein the decoding calculating means is a multiplier that performs the multiplication of the 1st group of elements $\alpha^w$: $(A_{w,\,i-1}, A_{w,\,i-2}, A_{w,\,i-3}, \ldots, A_{w,\,3}, A_{w,\,2}, A_{w,\,1}, A_{w,\,0})^T$ and the 2nd group of elements $\alpha^v$: $(A_{v,\,i-1}, A_{v,\,i-2}, A_{v,\,i-3}, \ldots, A_{v,\,3}, A_{v,\,2}, A_{v,\,1}, A_{v,\,0})^T$ of the Galois field GF $(2^i)$, respectively; and has a multiplier that is provided with i units of multiplier sections that perform the parallel multiplication of the first element, and $\alpha^0$, $\alpha^1, \alpha^2, \alpha^3, \ldots, \alpha^{i-3}, \alpha^{i-2}, \alpha^{i-1}$, of the primitive element $\alpha$ of the Galois field, and i units of logic product calculating sections that perform in parallel the logic product calculations for the multiplication results of the i units of multiplying sections and the $A_{v,\,0}, A_{v,\,1}, A_{v,\,2}, A_{v,\,3}, \ldots, A_{v,\,i-3}, A_{v,\,i-2}, A_{v,\,i-1}$, respectively; and an adder section that adds the calculation results of the i units of logic product calculating sections.

6. The Reed-Solomon device of claim 1 wherein the decoding calculating means is a multiplier that performs the multiplication of the 1st group of elements $\alpha^w$: $(A_{w,\,i-1}, A_{w,\,i-2}, A_{w,\,i-3}, \ldots, A_{w,\,3}, A_{w,\,2}, A_{w,\,1}, A_{w,\,0})^T$ and the 2nd group of elements $\alpha^v$: $(A_{v,\,i-1}, A_{v,\,i-2}, A_{v,\,i-3}, \ldots, A_{v,\,3}, A_{v,\,2}, A_{v,\,1}, A_{v,\,0})^T$ of the Galois field GF (2i), respectively; and has a multiplier that is provided with i units of logic product calculating sections that perform in parallel the logic product calculations for the multiplication results of the 1st group of elements and the $A_{v,\,0}, A_{v,\,1}, A_{v,\,2}, A_{v,\,3}, \ldots, A_{v,\,i-3}, A_{v,\,i-2}, A_{v,\,i-1}$, respectively; i units of multiplier sections that perform the parallel multiplication of the calculation results of the logic product calculating sections and $\alpha^0, \alpha^1, \alpha^2, \alpha^3, \ldots, \alpha^{i-3}, \alpha^{i-2}, \alpha^{i-1}$, of the primitive element $\alpha$ of the Galois field, and an adder section that adds the calculation results of the i units of multiplying sections.

* * * * *